(12) United States Patent
Jou et al.

(10) Patent No.: US 8,555,211 B2
(45) Date of Patent: Oct. 8, 2013

(54) MASK MAKING WITH ERROR RECOGNITION

(75) Inventors: Jia-Guei Jou, Taipei (TW); Kuan-Chi Chen, Hsinchu (TW); Peng-Ren Chen, Hsinchu (TW); Dong-Hsu Cheng, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/416,897

(22) Filed: Mar. 9, 2012

(65) Prior Publication Data

US 2013/0239072 A1 Sep. 12, 2013

(51) Int. Cl.
*G06F 17/50* (2006.01)

(52) U.S. Cl.
USPC ............... 716/53; 716/52; 716/54; 716/55; 716/56; 430/5; 430/30

(58) Field of Classification Search
USPC .................... 716/50–56; 430/5, 30
See application file for complete search history.

(56) References Cited

U.S. PATENT DOCUMENTS

2008/0263501 A1* 10/2008 Chen et al. ............ 716/19
2008/0295062 A1* 11/2008 Wu et al. ............ 716/21
2013/0042210 A1* 2/2013 Lu et al. ............ 716/53

* cited by examiner

*Primary Examiner* — Nha Nguyen
(74) *Attorney, Agent, or Firm* — Haynes and Boone, LLP

(57) ABSTRACT

A method of making a mask includes receiving an IC design layout from a designer, applying an logic operation (LOP) correction, performing an OPC correction, fracturing the modified data into a plurality of main features in an electron beam format, and sending the electron beam format data to a mask writer for a mask fabrication. An XOR operation is implemented into the method to check and verify if a pattern is lost during OPC modification and/or data fracture. A BACKBONE XOR operation is also implemented into the method for a plurality of main features with a critical dimension (CD) size smaller than the max OPC correction to check and verify if a small pattern feature is lost during OPC modification and/or data fracture for 45 nm and beyond semiconductor technologies.

20 Claims, 11 Drawing Sheets

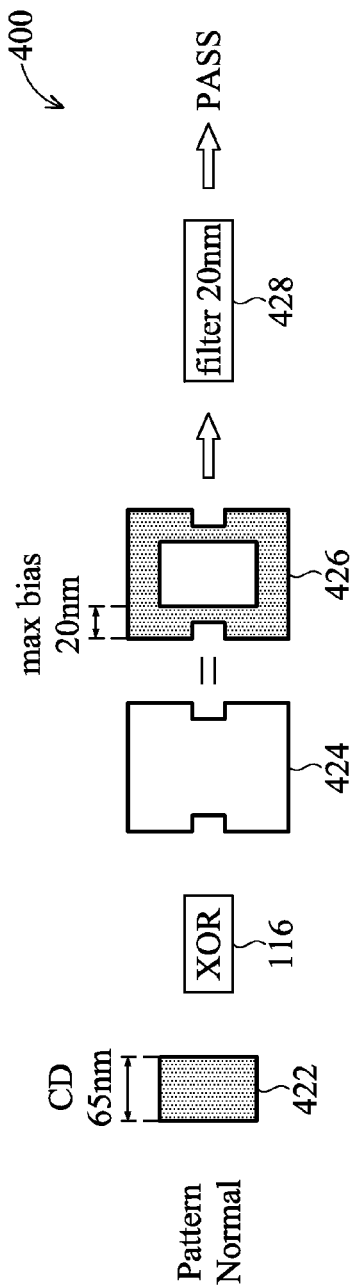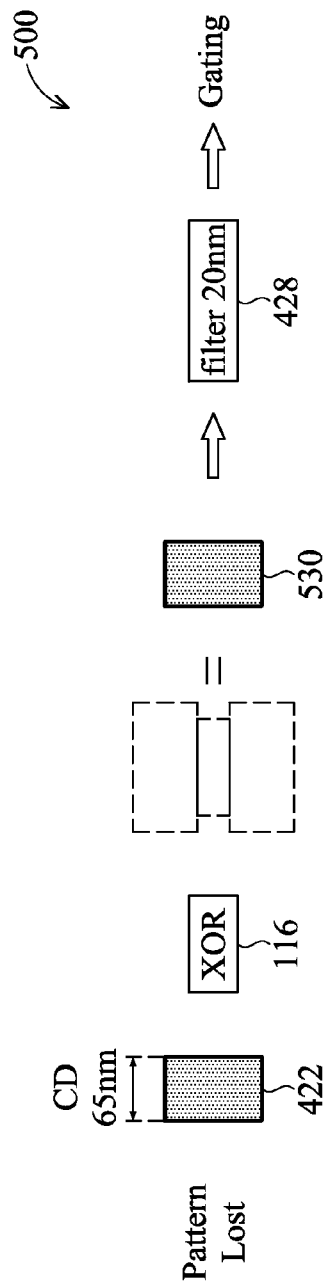

MASK MAKING WITH ERROR RECOGNITION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while feature size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, lithography processes often use techniques such as optical proximity correction (OPC) and assist features, such as scatter bars, to improve and enhance the quality of an image on a mask that is to be exposed on a substrate. With shrinking feature sizes, such techniques become more complicated and difficult to perform, especially when fracturing or modifying the data to be imaged. The OPC and/or assist features may be lost or adversely modified during the scaling down process.

Accordingly, what is needed is a method and system to provide a quality assurance to facilitate the scaling down process and the use of techniques such as OPC and/or assist features.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion

FIGS. 4 and 5 show the XOR operation being used to gate a missing pattern in a first QA method of the present disclosure.

DETAILED DESCRIPTION

Figure 1:
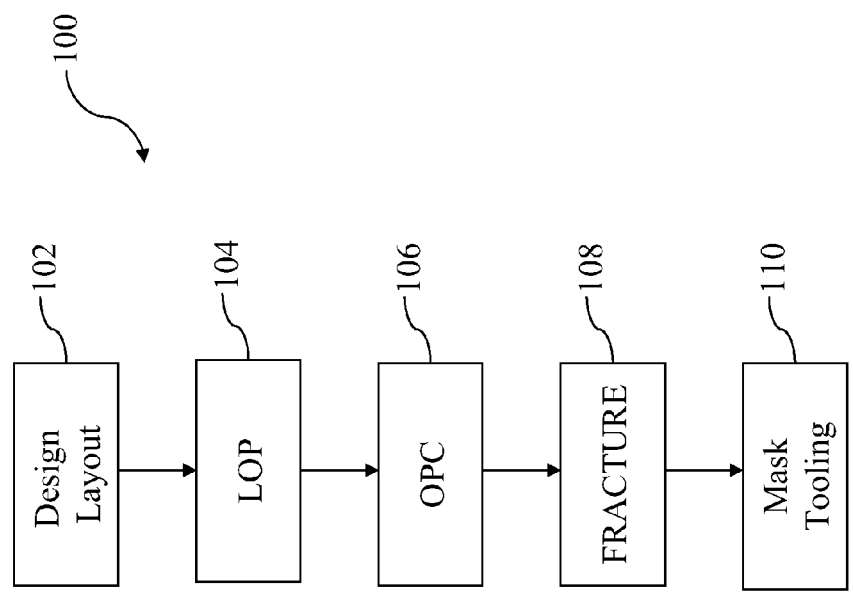
FIG. 1 is a block diagram of a mask making method for implementing one or more embodiments of the present disclosure.

The present disclosure relates generally to mask manufacturing and optimization, and more particularly, to a method of checking and verifying the fractured data integrity during photo mask making for advanced integrated circuit (IC) production.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a flow chart of a method 100 illustrates one embodiment of a mask making process. In the present disclosure, the term mask, photo-mask and reticle are used to refer to the same item. The method 100 begins at step 102 by providing or receiving an IC design layout data (or IC design layout pattern) from a designer. The designer can be a separate design house or can be part of a semiconductor fabrication facility (fab) for making IC productions according to the IC design layout. In various embodiments, the semiconductor fab may be capable of making photo-masks, semiconductor wafers, or both. The IC design layout includes various geometrical patterns designed for an IC product and based on a specification of the IC product.

The IC design layout is presented in one or more data files having the information of the geometrical patterns. In one example, the IC design layout is expressed in a "gds" format known in the art. The designer, based on the specification of the product to be manufactured, implements a proper design procedure to carry out the IC design layout. The design procedure may include logic design, physical design, and/or place and route. As an example, a portion of the IC design layout includes various IC features (also referred to as main features), such as active region, gate electrode, source and drain, metal lines and vias of an interlayer interconnection, and openings for bonding pads, to be formed in and on a semiconductor substrate (such as a silicon wafer) and various material layers disposed over the semiconductor substrate. The IC design layout may include certain assist features, such as for imaging effect, processing enhancement, and/or mask identification information.

As shown in FIG. 1, the method 100 proceeds to step 104 by performing a logic operation with small bias corrections requested by the fab (LOP). Execution then proceeds to step 106 in which an OPC modification to the LOP modified designed layout data is performed. The OPC modified designed layout data prepared at step 106 proceeds to step 108 for fracturing the OPC modified design layout data into a plurality of polygons (or trapezoids) in an electron beam format for a mask writer. A polygon of the IC design layout is also referred to as a main feature. The fractured IC design layout data proceeds to step 110 for mask tooling (or mask making, or mask fabrication). Creating a plurality of designed layout patterns on a mask is carried out by an electron beam writer, an ion beam writer or a laser beam writer.

The OPC modification and data fracture become more and more complicated with the IC design scaling down process. For example, an error may occur if/when a pattern is lost during the OPC modification and/or data fracture. Therefore it is necessary to implement a quality assurance (QA) method into the mask making process to check and verify the correctness of fractured data, including identifying and/or preventing pattern lost from the OPC modification and/or data fracture.

Figure 2:
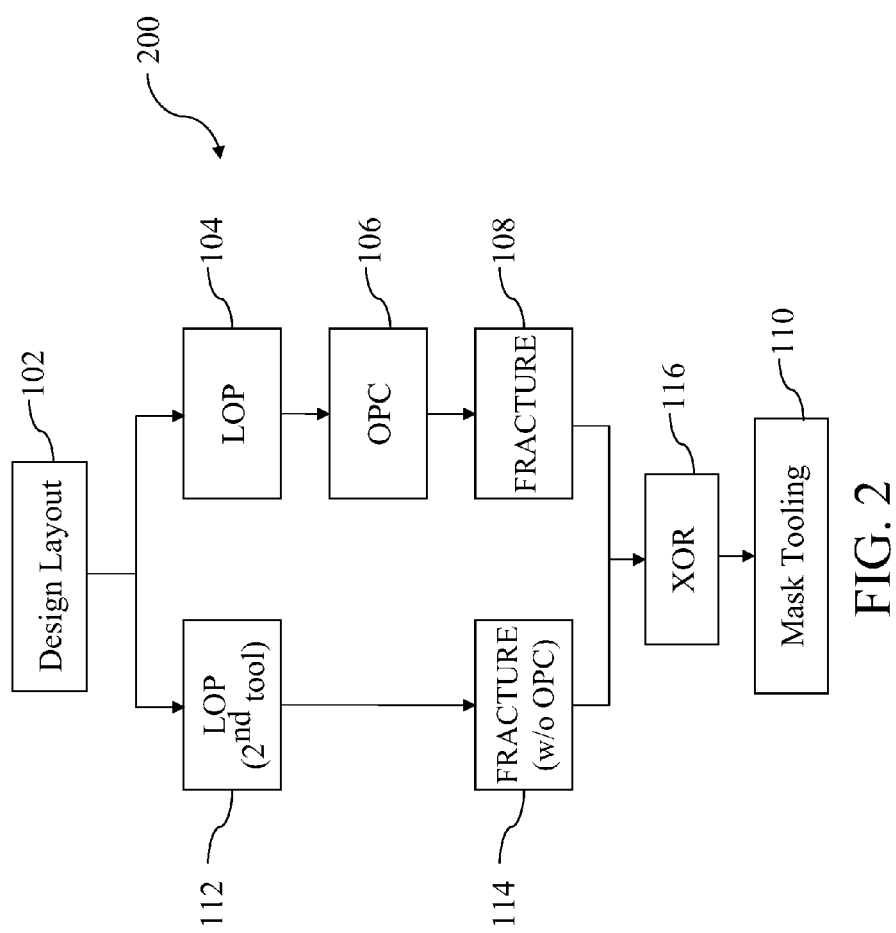
FIG. 2 is a flow chart of a first quality assurance (QA) method with an XOR operation implemented for making masks according to one or more embodiments of the present disclosure.

Referring now to FIG. 2, a method 200 provides quality assurance (QA) to check and verify the OPC modified IC design layout data and fractured data integrity. The method 200 begins at step 102 by providing or receiving an IC design layout data (or IC design pattern) from a designer. The method 200 proceeds to step 104 by performing a LOP modification to the IC design layout on a first tool. The LOP modified design layout data prepared at step 104 proceeds to step 106 by performing an OPC modification to the LOP modified designed layout data. The OPC modified design layout data prepared at step 106 proceeds to step 108 to be fractured into a plurality of polygons (or trapezoids) in an electron beam format for a mask writer.

As shown in FIG. 2, the design layout data receiving at step 102 also proceeds to step 112 by performing a LOP modification to the same IC design layout data on a second tool. The LOP modified IC design layout data on second tool proceeds to step 114 to fracture into a plurality of polygons in an electron beam format without OPC modification. The fractured data with an OPC modification prepared at step 108 is compared to the fractured data without OPC modification prepared at step 114 to check and verify the pattern integrity at step 116. In the present embodiment, the operation at step 116 is an XOR operation process, examples of which are provided below.

Figure 3:
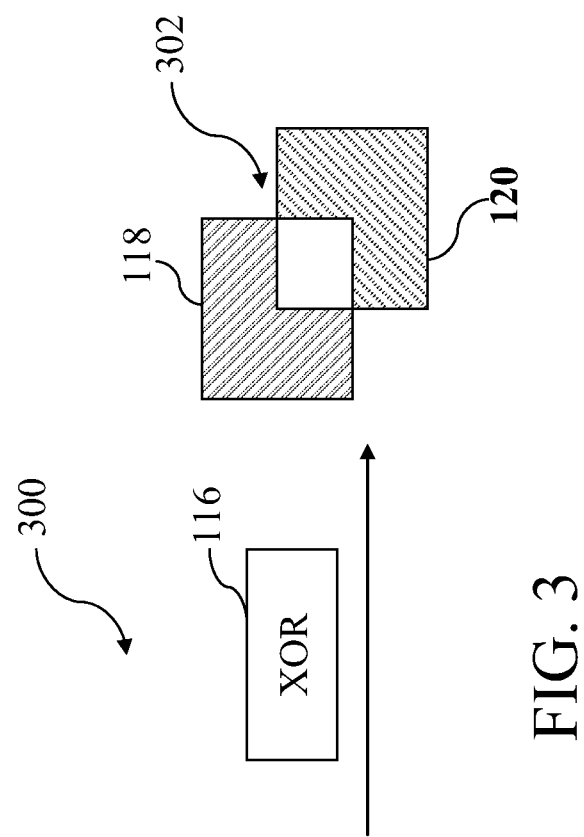
FIG. 3 is a description of an XOR operation for implementing one or more embodiments of the present disclosure.

FIG. 3 provides an example 300 of an XOR operation according to one or more embodiments of the present disclosure. Continuing with the method 200 of FIG. 2, the XOR operation 116 is used to compare patterns 118 and 120 and highlight any differences between the two. The operation result produces a "difference" 302 between pattern 118 and pattern 120, as shown in FIG. 3. This method or process at step 116 to highlight the difference between the two patterns in FIG. 3 is referred to as an XOR operation.

FIGS. 4 and 5 provide examples 400, 500, respectively, of the XOR operation to check and verify the fractured IC layout data integrity according to one or more embodiments of the present disclosure. Referring specifically to FIG. 4, a pattern 422 is included in the design layout, and includes a 65 nanometers (nm) CD feature as shown. A pattern 424 is the OPC modified pattern and a pattern 426 is a result of the XOR operation 116 for pattern 422 and pattern 424 comparison, and thereafter a difference between pattern 422 and pattern 424 is shown as pattern 426. Generally, OPC modification adds a different bias to a defined feature at various locations. For an example as shown in FIG. 4, the max bias for OPC modification is 20 nm. The max bias 20 nm is set as a filter 128 to check the pattern 426. If all features are less than the max bias 20 nm, the OPC pattern 124 is correct and a "PASS" is indicated. The OPC modified design data passes the XOR operation of the QA process and further proceeds to a mask writer for mask fabrication.

Referring now to FIG. 5, in this example, the OPC modification pattern 424 (FIG. 4) is lost during the OPC modification or data fracture process. In this case, the XOR operation result is shown in FIG. 5 as a pattern 530. The same max bias 20 nm filter 128 is performed on the pattern 530. The feature of the pattern 530 is larger than the max bias 20 nm as set in the filter 428 and is flagged, and therefore an error in modified IC design data is notified and is sent for GATING. GATING may require that the process be repeated, engineering intervention, or other QA process.

The OPC modified IC design pattern is more complicated when semiconductor technologies are continuously progressing to smaller and smaller feature sizes, such as 45 nm, 40 nm and beyond. When the feature CD size is smaller, the OPC bias size becomes comparatively larger. Furthermore, it becomes even more advantageous to include certain assist features for image enhancement effect. Therefore, with the feature size shrinking, it is more challenging to run an OPC modification and fracture of the IC design pattern data. Improvements to the XOR method is desired.

Figure 6:
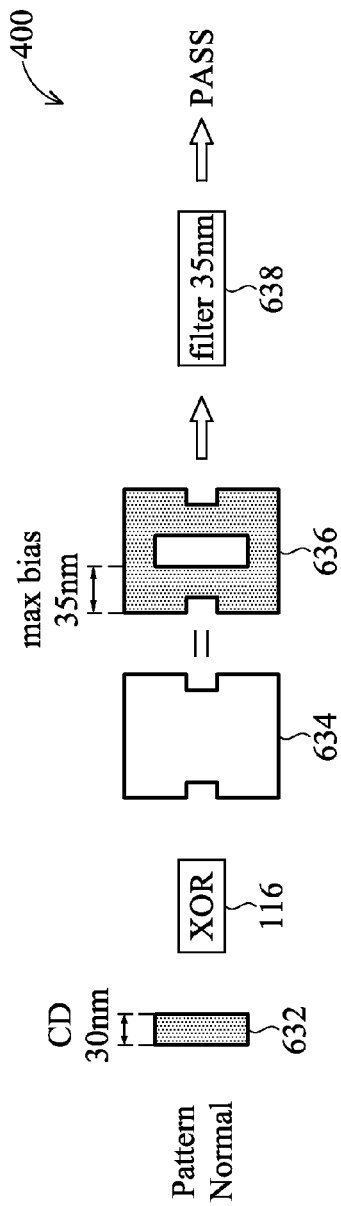
FIGS. 6 and 7 illustrate the XOR operation when CD size is shrunk in the first QA method of the present disclosure.
Figure 7:
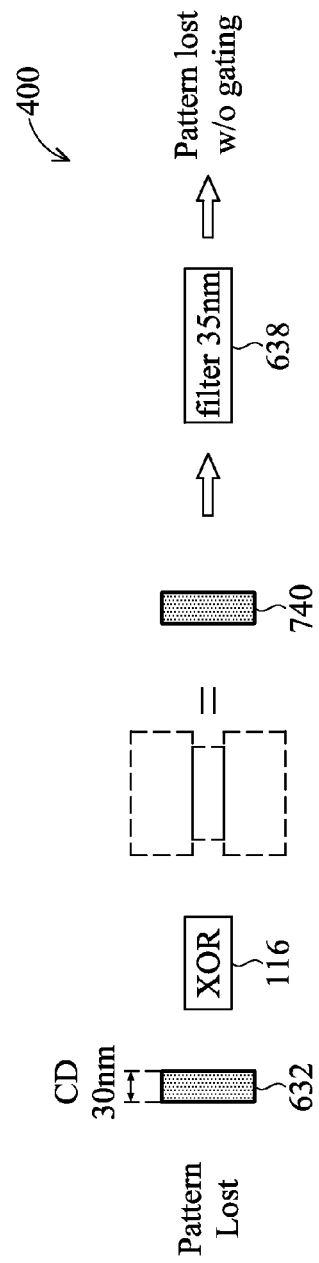

FIGS. 6 and 7 provide examples 600, 700, respectively, that illustrate limitations to the XOR operation 116. Referring specifically to FIG. 6, a pattern 632 is included in the design layout, and includes a 30 nm CD feature as shown. A pattern 634 is an OPC modified pattern on the mask for the feature with 30 nm CD, and a pattern 636 is the XOR operation 116 result for pattern 632 and pattern 634 comparison. Generally, OPC modification adds a different bias to a defined feature on mask at various locations. For example as shown in FIG. 6, the max bias for OPC modification is 35 nm for a feature with 30 nm CD. The max bias 35 nm is set as a filter 638 to check the pattern 636. If all features are less than the max bias 35 nm, the OPC pattern 634 is correct. The OPC modified design data passes the XOR operation 116 of the QA process and proceeds to a mask writer for further mask making.

Referring now to FIG. 7, the OPC modification pattern 634 (FIG. 6) for the pattern 632 is lost during OPC modification or data fracture process. In this case, the XOR operation result is a pattern 740. The max bias 35 nm filter 638 is performed on the pattern 740. Because the feature size with 30 nm CD is smaller than the max bias 35 nm filter 638, the lost pattern is not gated. The fractured data with the error may proceed to a mask writer for a mask fabrication and wafer scrap may occur.

Figure 8:
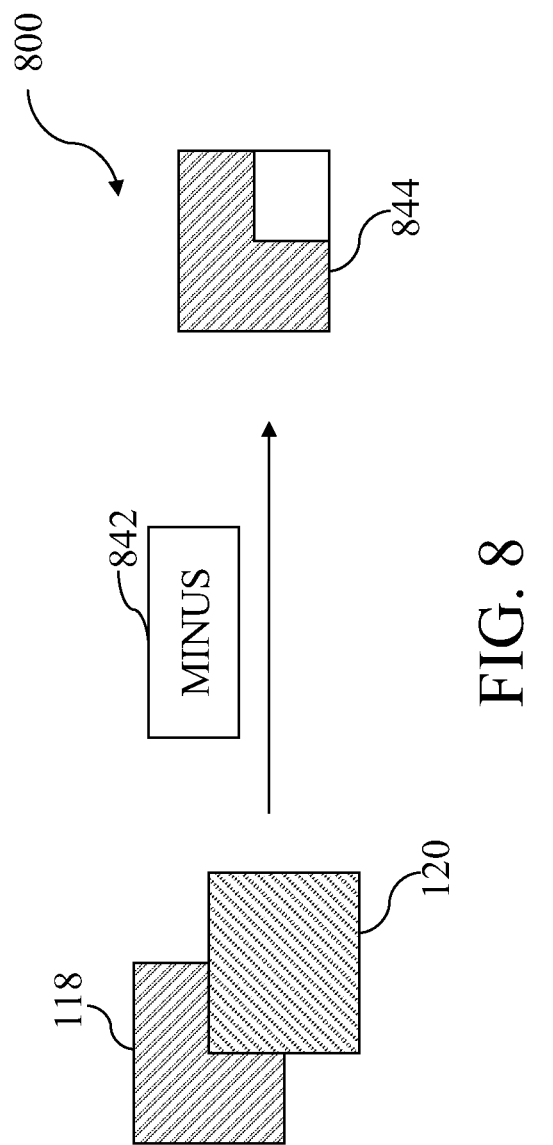
FIG. 8 is a description of a MINUS operation for implementing one or more embodiments of the present disclosure.

FIG. 8 provides an example 1200 of a MINUS operation 842 according to one or more embodiments of the present disclosure. Continuing with the method 200 of FIG. 2, the MINUS operation 842 is used to compare patterns 118 and 120 and highlight any differences between the two. The operation result produces a "difference" 844 between pattern 118 and pattern 120, as shown in FIG. 8.

Figure 9:
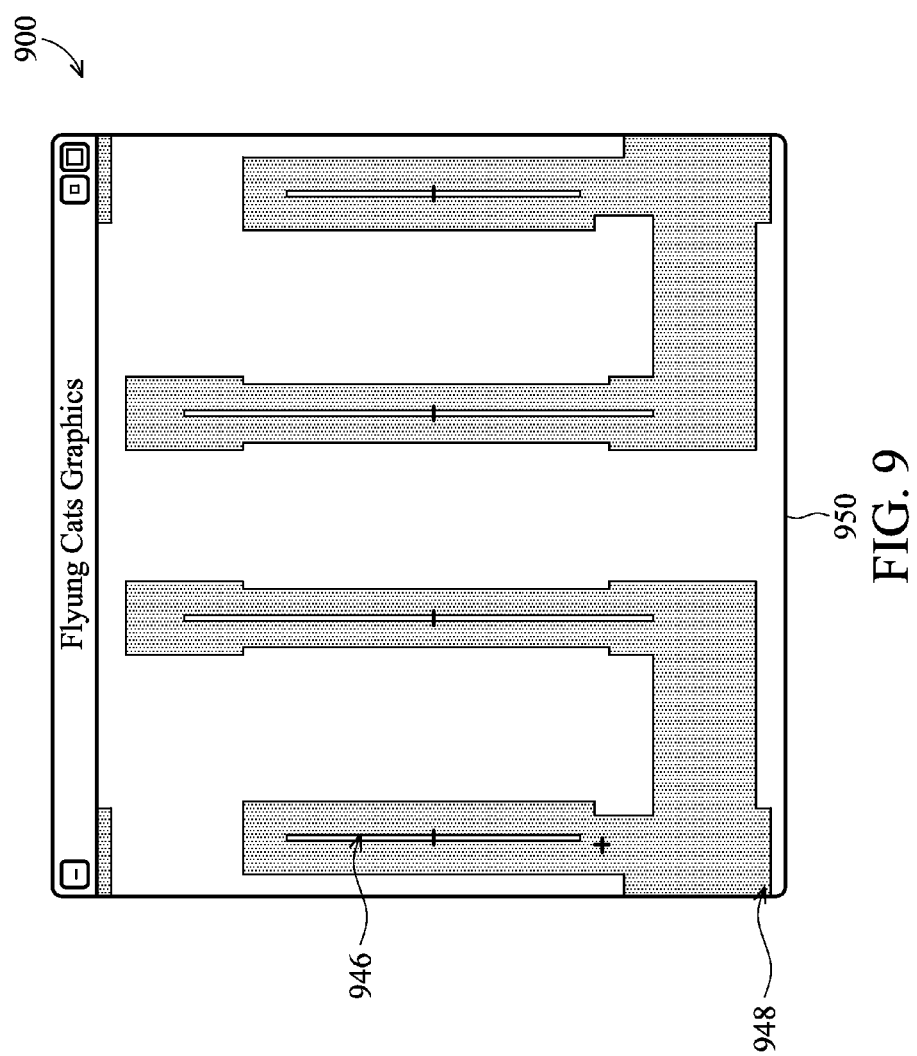
FIG. 9 is a description of a BACKBONE operation for implementing one or more embodiments of the present disclosure.

Referring to FIG. 9, the MINUS operation 842 will be used with a BACKBONE operation 1300 according to one or more embodiments of the present disclosure. The BACKBONE operation 1300 inserts a relatively small feature, a "backbone", into a patterned feature. In the example of FIG. 9, a 5nm backbone 946 is inserted into each polygon with a CD size smaller than the max OPC bias size. Continuing with the example of FIG. 9, a backbone 946 is inserted into to a portion 948 of an IC design layout 150. The BACKBONE operation 1300 and the MINUS operation 842 are combined and referred to as a BACKBONE XOR operation, as described below.

Figure 10:
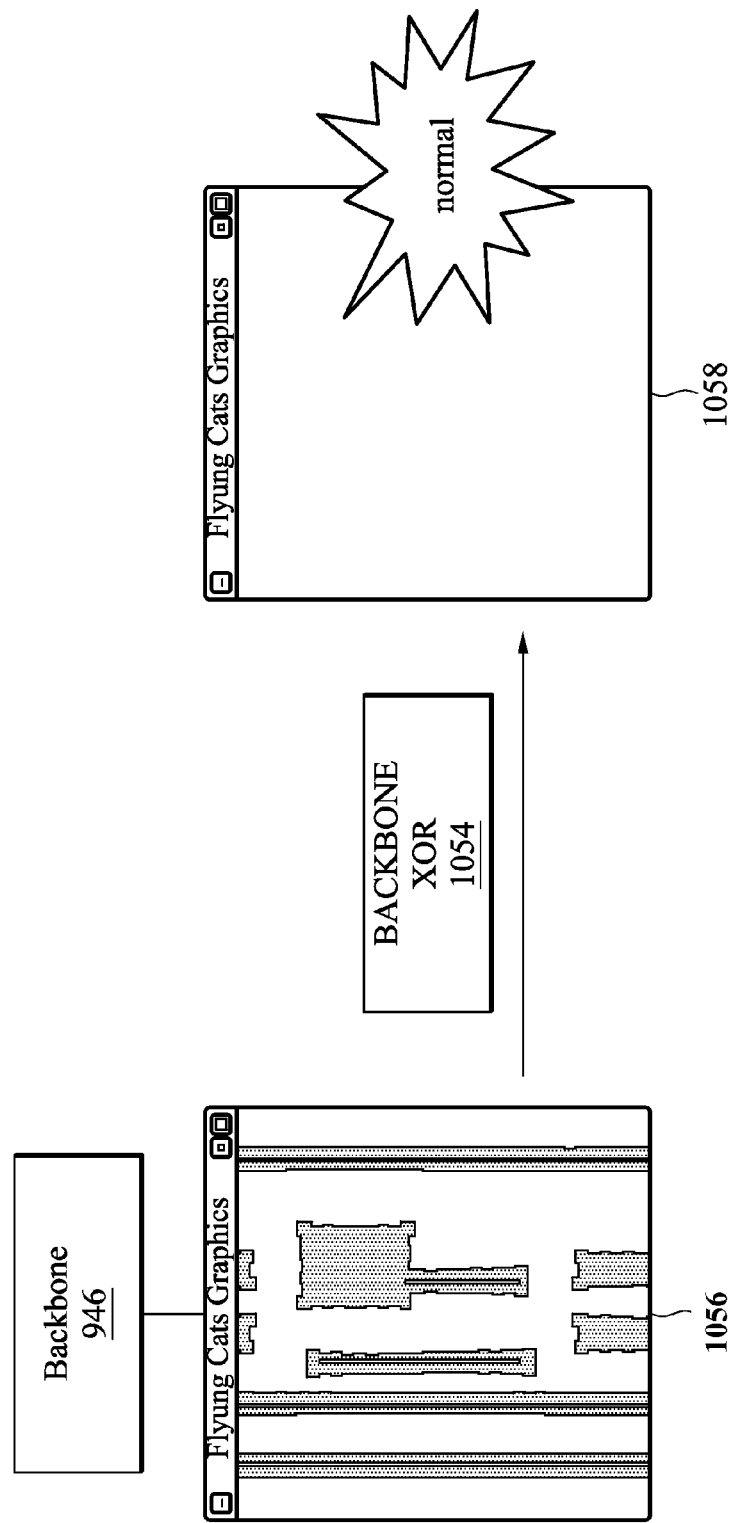
FIGS. 10 and 11 illustrate BACKBONE XOR operation for implementing one or more embodiments of the present disclosure.
Figure 11:
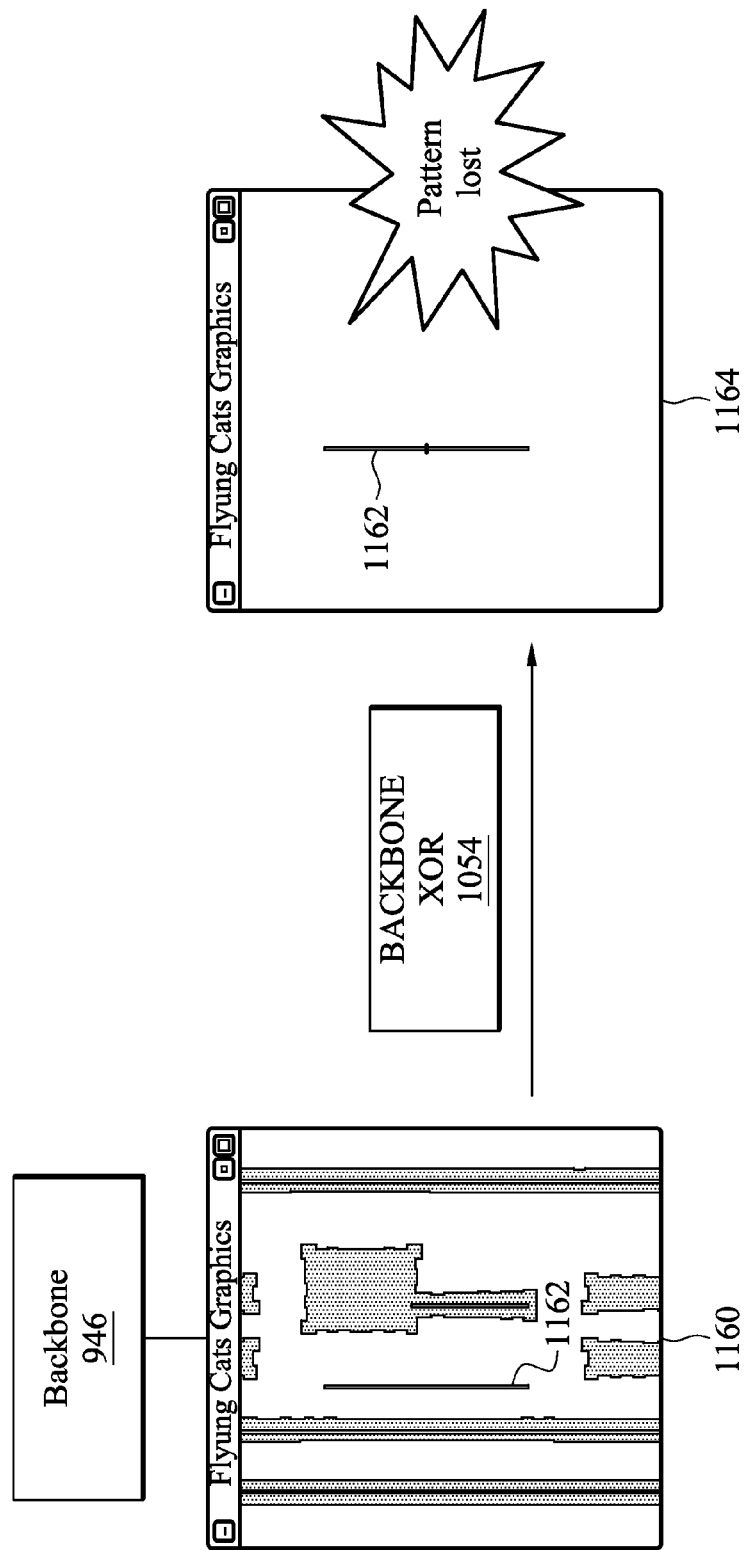

FIGS. 10 and 11 provide examples 1000, 1100, respectively, of a BACKBONE XOR operation to check and verify the fractured IC layout data integrity according to one or more embodiments of the present disclosure. Referring specifically to FIG. 10, a BACKBONE operation 946 is performed on a design layout to form a backbone Boolean pattern 1056. A backbone is only assigned to the feature portions with a CD smaller than the max OPC correction size. As shown in FIG. 10, the feature portions with a large CD are not assigned a backbone. The backbone Boolean pattern 1056 includes any OPC modification and is provided to a BACKBONE XOR operation 1054 to produce the result in picture 1058. In the pattern picture 1058, no backbone is observed and therefore the fractured pattern in backbone Boolean pattern 1056 is normal and passes inspection.

Referring now to FIG. 11, a pattern 1160 is the same as pattern 1056 (FIG. 10), except that one of the features is missing due to the OPC modification. However, the BACKBONE operation 946 performed properly, and as a result, a backbone 1162 still remains. The backbone pattern proceeds by performing a BACKBONE XOR operation 1054 to produce a resulting picture 1164. In the resulting picture 1164, the backbone 1162 is detected, indicating a feature is missing in the fractured modified IC design layout data. The error can then be handled, accordingly.

Figure 12:
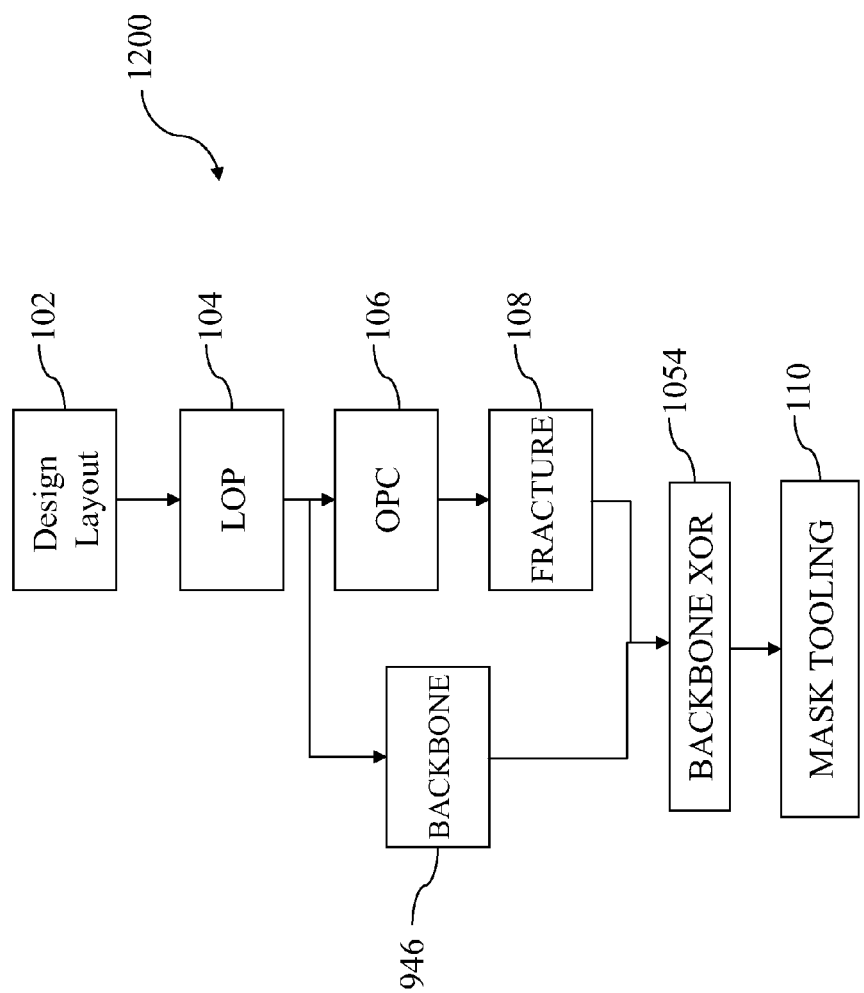
FIG. 12 shows a second QA method for mask making according to one or more embodiments of the present disclosure.

The BACKBONE and BACKBONE XOR operations can be used in various ways. Referring to FIG. 12, a method 1200 utilizes the BACKBONE operation 946 and the BACKBONE XOR operation 1054, along with the method 100 (FIG. 1), for a mask making process according to one or more embodiments of the present disclosure. The method 1200 begins by receiving the modified IC design layout data by performing a LOP modification as described in step 104 of FIG. 2. After the LOP modification, the method continues to step 106 for OPC modification and thereafter to step 108 for fracturing the modified IC design layout data into an electron beam format for a mask writer. The LOP modified IC design data also proceeds to step 946 for a BACKBONE operation by assigning very small backbones to a plurality of small features with a CD less than the max OPC correction (or bias) value. Two sets of modified data are created: one being the fractured electron beam format data from step 108 and another being the backbone modified data from step 946. The method proceeds to step 1054 to perform a BACKBONE XOR operation to check and verify the electron beam format data integrity. The BACKBONE XOR operation is used to check and verify the fractured IC design layout data integrity for 45 nm and beyond semiconductor technologies, according to one or more embodiments of the present disclosure.

Figure 13:
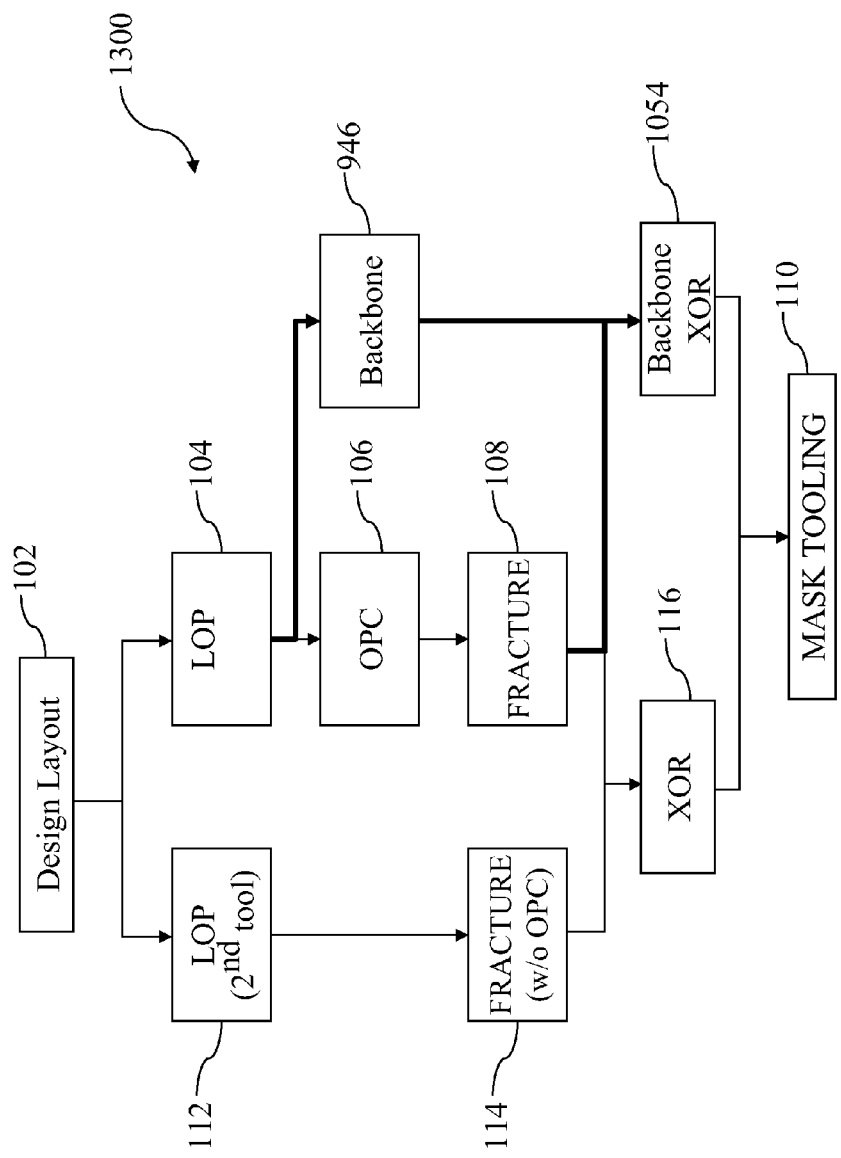
FIG. 13 shows a third QA method for mask making according to one or more embodiments of the present disclosure.

Referring to FIG. 13, a method 1200 utilizes the BACKBONE operation 946 and the BACKBONE XOR operation 1054, along with the method 200 (FIG. 2), for a mask making process according to one or more embodiments of the present disclosure. The method 1300 begins at step 102 by providing or receiving an IC design layout data (or IC design pattern) from a designer. The method 1300 proceeds to step 104 by performing a LOP modification to the IC design layout on a first tool. The LOP modified design layout data prepared at step 104 proceeds to step 106 by performing an OPC modification to the LOP modified designed layout data. The OPC modified design layout data prepared at step 106 proceeds to step 108 to be fractured into a plurality of polygons (or trapezoids) in an electron beam format for a mask writer.

The design layout data receiving at step 102 also proceeds to step 112 by performing a LOP modification to the same IC design layout data on a second tool. The LOP modified IC design layout data on the second tool proceeds to step 114 to fracture into a plurality of polygons without OPC modification. The fractured data with OPC modification prepared at step 108 is compared to the fractured data without OPC modification prepared at step 114 to check and verify the pattern integrity after the OPC modification and the data fracture by a quality assurance (QA) method according to one or more embodiments of the present disclosure.

The fractured data with OPC modification prepared at step 108 and the fractured data without OPC modification prepared at step 114 proceed to step 116 for XOR operation to check and verify the data error during the OPC modification or during the data fracture.

The LOP modified IC design data also proceeds to step 946 by assigning a very small (e.g., 5 nm) backbone to a plurality of small features with a CD less than the max OPC correction (or bias) value. Two sets of modified data, one fractured data for electron beam format from step 108 and another backbone modified data from step 946, proceed to step 1054 to perform a BACKBONE XOR operation to check and verify the fractured data for electron beam format data integrity.

After passing XOR operation at step 116 and the BACKBONE XOR operation at step 1054, the fractured IC design data with OPC modification may proceed to a mask writer 110 for mask tooling or fabrication.

Thus, the present disclosure describes a unique a mask making method for 45 nanometer and beyond semiconductor technology. In one embodiment, a method include receiving an IC design layout data with a plurality of main features, applying a logic operation (LOP) correction, performing an optical proximity correction (OPC) modification, fracturing the OPC modified data into a plurality of polygon in an electron bean format, performing a XOR operation on the data, assigning a backbone to plurality of features with the CD size smaller than the max OPC correction size (BACKBONE), and performing a backbone MINUS electron beam format data (BACKBONE XOR). After the fractured data passing both XOR and BACKBONE XOR data check and verification, the data is sent on for a mask tooling (making) or fabrication.

In one embodiment, a method of making a mask includes applying a logic operation (LOP) correction on one tool, performing an optical proximity correction (OPC) and fracturing the LOP modified IC design layout data into a plurality of polygons in an electron beam format. In another embodiment, a method of making a mask further includes applying a logic operation (LOP) correction on another tool, and fracturing the LOP modified IC design layout data without an optical proximity correction (OPC). Two sets of fractured IC design layout data, one with OPC correction and one without OPC correction, performing a XOR operation to highlight the difference between the sets of data. The max OPC correction size is chosen to as a filter to check the difference and verify if a pattern missing during the data OPC modification and/or data fracture.

In one embodiment, a method of making a mask includes applying a logic operation (LOP) correction on a tool, performing an optical proximity correction (OPC) and fracturing the LOP modified IC design layout data into a plurality of polygons in an electron beam format. In another embodiment, the LOP modified IC design data, may also perform a BACKBONE operation by assigning a backbone to a plurality of small features with a CD size smaller than the max OPC correction size, and thereafter perform a BACKBONE XOR operation by applying BACBONE minus electron beam format data to check and verify if a small feature is list during OPC modification and data fracture.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a mask, comprising:
    receiving an integrated circuit (IC) design layout data having a plurality of main features;
    performing an optical proximity correction (OPC) on the plurality of main features of the received IC design layout data to produce a first image;
    after performing the OPC on the plurality of main features, fracturing the first image to produce a fractured first image;
    inserting backbones in the plurality of main features of the received IC design layout data to produce a second image;
    performing, by using a computer, a comparison operation on the fractured first image and the second image to identify an error, wherein the error is identified by determining whether a difference between the fractured first image of the plurality of main features and the second image of the plurality of main features is greater than an predetermined dimensional value; and
    if no error is found, fabricating a mask based on the first image.

2. The method of claim 1, further comprising:
    after inserting backbones, fracturing the second image to produce a fractured second image, and
    wherein performing the comparison operation on the fractured first image and the second image to identify the error includes performing the comparison operation on the fractured first image and the fractured second image to identify the error.

3. The method of claim 2, further comprising, applying a logic operation (LOP) on the received IC design layout data prior to performing OPC and inserting backbones, wherein the LOP modifies the IC design layout by adding a bias to the plurality of main features.

4. The method of claim 2, wherein the comparison includes an XOR operation.

5. The method of claim 4, further comprising filtering the first and second image with a max OPC bias size filter.

6. The method of claim 5, wherein the comparison searches for a backbone without a corresponding main feature.

7. The method of claim 6, wherein the predetermined dimensional value is a size of the max OPC filter,
    wherein there is no error if the difference between the fractured first image and the fractured second image is smaller than the size of the max OPC filter, and there is an error if the difference between the fractured first image and the fractured second image is larger than the size of the max OPC filter.

8. The method of claim 2, wherein fracturing the first and second images includes converting the IC design layout data to an electron beam format data or a laser beam format data.

9. A method of fabricating a mask, comprising:
    receiving an IC design layout data having a main feature;
    applying a logic operation (LOP) correction on the main feature of the received IC design layout data to produce a first image;
    performing an optical proximity correction (OPC) on the first image to produce a second image;
    fracturing the second image to produce a fractured second image;
    performing, by using a computer, a pattern XOR operation on the first image and the fractured second image to determine if a first error occurred, wherein the first error is determined by determining whether a difference between the fractured second image of the main feature and the first image of the main feature is greater than an predetermined dimensional value;
    inserting a backbone on the main feature to produce a third image;
    determining a second error by performing a pattern MINUS operation on the fractured second image and the third image, wherein the second error is determined by identifying a portion of the main feature that is not present in one of the fractured second image and the third image; and
    if neither a first or second error occurred, writing the second image onto a mask.

10. The method of claim 9, wherein applying a LOP correction includes adding a small bias on the received IC design layout data on two tools, the IC design layout data on the first tool being used for the first image, and the IC design layout data on the second tool being used for the second image.

11. The method of claim 9 further comprising:
    fracturing the third image;
    wherein performing a pattern XOR operation includes highlighting a difference between the first image and the fractured second image.

12. The method of claim 11 wherein determining whether the difference between the fractured second image of the main feature and the first image of the main feature is greater than an predetermined dimensional value includes examining a size of the difference using a max OPC correction size as a criteria to check and verify if the main feature is lost during OPC or fracturing.

13. The method of claim 12, wherein inserting the backbone comprises inserting a feature with a small feature less than the max OPC correction (BACKBONE); and
    wherein performing the pattern MINUS operation includes comparing the fractured second image and the third image to check and verify if a pattern lost during OPC or data fracturing.

14. The method of claim 13, wherein writing the second image onto the mask includes writing a pattern using an electron beam writer, ion beam writer or a laser beam writer.

15. A method for making a mask, comprising:
    receiving a design layout having a plurality of main features;
    inserting a backbone on one main feature from the plurality of main features to produce a first image;
    performing optical proximity correction (OPC) on the one main feature from the plurality of main features to produce a second image;
    performing, by using a computer, an XOR operation on the first and second images to produce a resulting image, the resulting image representing whether the one main feature from the plurality of main features from the first image is present in the second image, wherein when the one main feature from the plurality of main features from the first image is not present in the second image the resulting image includes the inserted backbone on the one main feature;
    determining if the backbone exists in the resulting image; and if the backbone does not exists in the resulting image, making the mask with the second image.

16. The method of claim 15 further comprising:
fracturing the first and second image prior to performing the XOR operation.

17. The method of claim 15 further comprising:
performing a logic operation (LOP) correction on the design layout prior to inserting a backbone or performing OPC.

18. The method of claim 15 further comprising:
filtering the resulting image for a maximum OPC correction.

19. The method of claim 15 wherein the one main feature has a critical dimension (CD) smaller than a maximum OPC correction.

20. The method of claim 19 wherein the backbone has a CD smaller than the one main feature CD.

* * * * *